(12) United States Patent
Borah et al.

(10) Patent No.: US 12,348,256 B2
(45) Date of Patent: Jul. 1, 2025

(54) SAMPLER CIRCUIT FOR HIGH SPEED SERIALIZER/DESERIALIZER

(71) Applicant: TEXAS INSTRUMENTS INCORPORATED, Dallas, TX (US)

(72) Inventors: Anindita Borah, Santa Clara, CA (US); Ramsin Ziazadeh, San Jose, CA (US); Ashwin Ramachandran, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 96 days.

(21) Appl. No.: 18/478,198

(22) Filed: Sep. 29, 2023

(65) Prior Publication Data

US 2025/0112661 A1     Apr. 3, 2025

(51) Int. Cl.
*H04B 1/38* (2015.01)
*H03F 3/19* (2006.01)
*H03K 17/56* (2006.01)

(52) U.S. Cl.
CPC .............. *H04B 1/38* (2013.01); *H03F 3/19* (2013.01); *H03K 17/56* (2013.01)

(58) Field of Classification Search
CPC .............. H04B 1/38; H03F 3/19; H03K 17/56
See application file for complete search history.

(56) References Cited

U.S. PATENT DOCUMENTS

| | | | | |
|---|---|---|---|---|
| 6,278,308 B1 * | 8/2001 | Partovi | ............ | H03K 3/356139 327/210 |
| 7,411,420 B2 * | 8/2008 | Doi | .................. | H04L 25/0292 327/51 |
| 10,965,383 B1 * | 3/2021 | Lekkala | ................ | G11C 7/1087 |
| 2004/0027185 A1 * | 2/2004 | Fiedler | ............. | H03K 3/356139 327/211 |
| 2006/0267685 A1 * | 11/2006 | Alenin | ...................... | H03F 1/48 330/258 |
| 2013/0049839 A1 * | 2/2013 | Cheng | .................. | H03D 1/2272 327/306 |
| 2020/0186129 A1 * | 6/2020 | Cheng | .................. | H03D 7/1458 |
| 2025/0016031 A1 * | 1/2025 | Lin | ....................... | H03F 3/4521 |

FOREIGN PATENT DOCUMENTS

| EP | 2166541 A1 * | 3/2010 | ............ G11C 27/026 |
|---|---|---|---|
| WO | WO-2005076478 A1 * | 8/2005 | ....... H03K 3/356043 |

* cited by examiner

*Primary Examiner* — Jean B Corrielus
(74) *Attorney, Agent, or Firm* — Mandy Barsilai Fernandez; Frank D. Cimino (57) ABSTRACT

In an example, a circuit includes a differential input circuit having a first input at a first capacitor terminal and a second input at a second capacitor terminal. The differential input circuit includes a first transistor having a first transistor control terminal and first and second terminals. The differential input circuit includes a second transistor having a second transistor control terminal and first and second terminals, the first terminals of the first and second transistors coupled together. The circuit includes a first capacitor having the first capacitor terminal and having another terminal coupled to the first transistor control terminal. The circuit also includes a second capacitor having the second capacitor terminal and having another terminal coupled to the second transistor control terminal. The circuit includes a first offset correction input coupled to the first transistor control terminal and a second offset correction input coupled to the second transistor control terminal.

20 Claims, 4 Drawing Sheets

SAMPLER CIRCUIT FOR HIGH SPEED SERIALIZER/DESERIALIZER

BACKGROUND

High speed data links are useful for transmitting high resolution signals, such as video. One high speed digital video interface is Flat Panel Display Link (FPD-Link). FPD-Link is used in a variety of applications, such as connecting the output from a graphics processing unit (GPU) to a display panel. FPD-Link is also useful for automotive applications such as navigation systems, vehicle entertainment systems, and backup cameras, as well as advanced driver assistance systems and autonomous vehicles. Sensitivity and signal-to-noise ratio (SNR) of the link circuitry are factors that can affect the performance of the data link.

SUMMARY

In at least one example of the description, a circuit includes a differential input circuit having a first input at a first capacitor terminal and a second input at a second capacitor terminal. The differential input circuit includes a first transistor having a first transistor control terminal and first and second terminals. The differential input circuit also includes a second transistor having a second transistor control terminal and first and second terminals, the first terminals of the first and second transistors coupled together. The circuit includes a first capacitor having the first capacitor terminal and having another terminal coupled to the first transistor control terminal. The circuit also includes a second capacitor having the second capacitor terminal and having another terminal coupled to the second transistor control terminal. The circuit includes a first offset correction input coupled to the first transistor control terminal and a second offset correction input coupled to the second transistor control terminal. The circuit includes a differential output circuit having a first output at a first inverter output, having a second output at a second inverter output, having a third transistor control terminal coupled to the second terminal of the first transistor, and having a fourth transistor control terminal coupled to the second terminal of the second transistor.

In at least one example of the description, a circuit includes a differential input circuit having a first transistor having a first transistor control terminal and first and second terminals. The differential input circuit also includes a second transistor having a second transistor control terminal and first and second terminals, the first terminals of the first and second transistors coupled together. The circuit includes a first capacitor coupled to the control terminal of the first transistor, and a second capacitor coupled to the control terminal of the second transistor. The circuit includes an offset correction circuit having a first terminal coupled to the control terminal of the first transistor and having a second terminal coupled to the control terminal of the second transistor. The circuit includes a differential output circuit having a third transistor having a third transistor control terminal coupled to the second terminal of the first transistor. The differential output circuit also has a fourth transistor having a fourth transistor control terminal coupled to the second terminal of the second transistor. The circuit includes a pre-amplifier circuit having a first terminal coupled to the second terminal of the first transistor and to the control terminal of the third transistor, and having a second terminal coupled to the second terminal of the second transistor and to the control terminal of the fourth transistor.

In at least one example of the description, a system includes an equalizer having an output. The system also includes an amplifier having an input coupled to the output of the equalizer, and having an output. The system includes a sampler having a first input coupled to the output of the amplifier, having an offset input, and having an output. The sampler includes a differential input circuit having a first input at a first capacitor terminal and a second input at a second capacitor terminal, the differential input circuit including a first transistor and a second transistor, the first transistor having a first transistor control terminal and first and second terminals, and the second transistor having a second transistor control terminal and first and second terminals. The sampler also includes a first capacitor having the first capacitor terminal and having another terminal coupled to the first transistor control terminal. The sampler includes a second capacitor having the second capacitor terminal and having another terminal coupled to the second transistor control terminal. The sampler includes a differential output circuit having a first output at a first inverter output, having a second output at a second inverter output, having a third transistor with a third transistor control terminal coupled to the second terminal of the first transistor, and having a fourth transistor with a fourth transistor control terminal coupled to the second terminal of the second transistor. The sampler includes a deserializer having an input coupled to the output of the sampler.

BRIEF DESCRIPTION OF THE DRAWINGS

The same reference numbers or other reference designators are used in the drawings to designate the same or similar (functionally and/or structurally) features.

DETAILED DESCRIPTION

High speed data links may use serializers and deserializers (SerDes) for transmitting data over a single line across the link. A serializer receives parallel data and converts it to serial data for transmission across the link. The deserializer receives the serial data from the link and converts it back to parallel data. The deserializer samples the data signals in the received serial data with a sampler circuit (e.g., sampler circuitry or a sampler) in time with a clock signal. The sampler decides if the data signal is 1 or 0, and then the received data is deserialized. The sampler may be a component of a decision feedback equalizer (DFE) circuit used to accurately sample the data signal. The DFE circuit uses a feedback loop that has a timing requirement, such that a sample is determined before the next sample arrives on the link. Therefore, any delay in the sampler is small to help avoid errors.

One sampler circuit uses a strongARM latch circuit that has two differential input pairs: one pair to receive the input signal and one pair to provide an offset voltage at the input for setting a reference voltage level for the input signal. In the strongARM latch circuit, the differential input pair that provides the offset voltage adds noise to the circuit. The cross-coupled latch in the strongARM latch circuit also has stacks of transistors coupled between a terminal that receives the input signal and a terminal that receives a voltage supply, which can reduce the speed of the latch, due to the time it takes for these transistors to turn on.

In examples herein, a sampler circuit is described that applies an offset voltage to the input signal without using a second differential input pair. The offset voltage is alternating current (AC)-coupled to the input signal differential pair. This structure provides a high impedance input for the offset voltage and eliminates the need for a second differential input pair, which results in lower noise and higher sensitivity than the strongARM latch circuit. In the sampler circuit described herein, the latch has fewer stacks of transistors than the strongARM latch circuit, which increases the speed of the sampler circuit. The sampler circuit described herein includes a pre-amplifier circuit (also referred to as a pre-amplification stage) that improves the sensitivity of the sampler circuit. The latch in the sampler circuit described herein also has a fast regeneration time.

Figure 1:
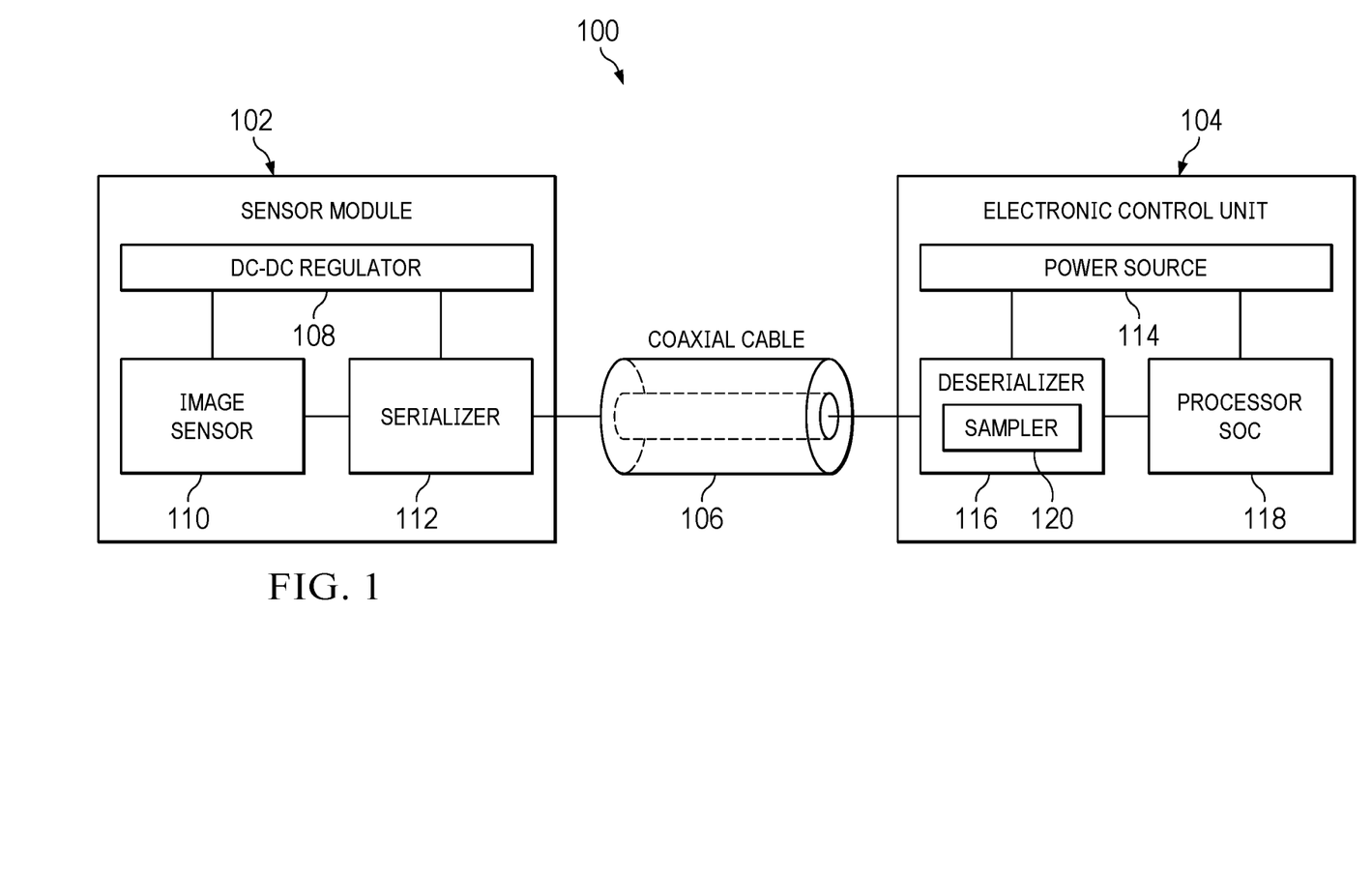
FIG. 1 is a block diagram of a SerDes in various examples.

FIG. 1 is a block diagram of a SerDes 100 in various examples herein. SerDes 100 includes a sensor module 102 and an electronic control unit (ECU) 104 that are connected via a coaxial cable 106. Sensor module 102 includes a DC-DC regulator 108, an image sensor 110, and a serializer 112. ECU 104 includes a power source 114, a deserializer 116, a processor system on a chip (SOC) 118, and a sampler 120.

DC-DC regulator 108 provides voltages to image sensor 110 and serializer 112. Image sensor 110 includes an output coupled to the input of serializer 112. Serializer 112 has an output coupled to coaxial cable 106. Deserializer 116 has an input coupled to coaxial cable 106. Power source 114 provides power to deserializer 116 and processor SOC 118. Deserializer 116 has an output coupled to an input of processor SOC 118.

Examples herein may be useful in FPD-Link applications. Serializer 112 may be an FPD-Link serializer that supports a high-speed raw data sensor, such as image sensor 110. Deserializer 116 may be an FPD-Link deserializer that receives serialized sensor data from a source through an FPD-Link interface. The data is received by deserializer 116 and provided to a processor, such as processor SOC 118.

In an example, sensor module 102 may be a sensor module in an automobile, and ECU 104 may be an automotive ECU. Image sensor 110 may receive an image from a camera, such as a backup camera. Image sensor 110 sends the image data to serializer 112, which serializes the data. Serializer 112 transmits the data from sensor module 102 to ECU 104 via coaxial cable 106. Any other type of link may be used to transmit the data, rather than coaxial cable 106. Deserializer 116 in ECU 104 receives the serialized data and performs deserialization, with the use of sampler 120. A processor SOC 118 may then perform further processing of the deserialized data.

In examples herein, deserializer 116 includes a sampler 120 as described above. Sampler 120 applies an offset voltage to the input signal without using a second differential input pair or differential input circuit. In sampler 120, a latch (not shown) has fewer stacks of transistors than the strongARM latch circuit, which increases the speed of sampler 120. Sampler 120 includes a pre-amplification stage (not shown) that improves the sensitivity of sampler 120. Sampler 120 is further described below by reference to FIGS. 3 and 4.

Figure 2:
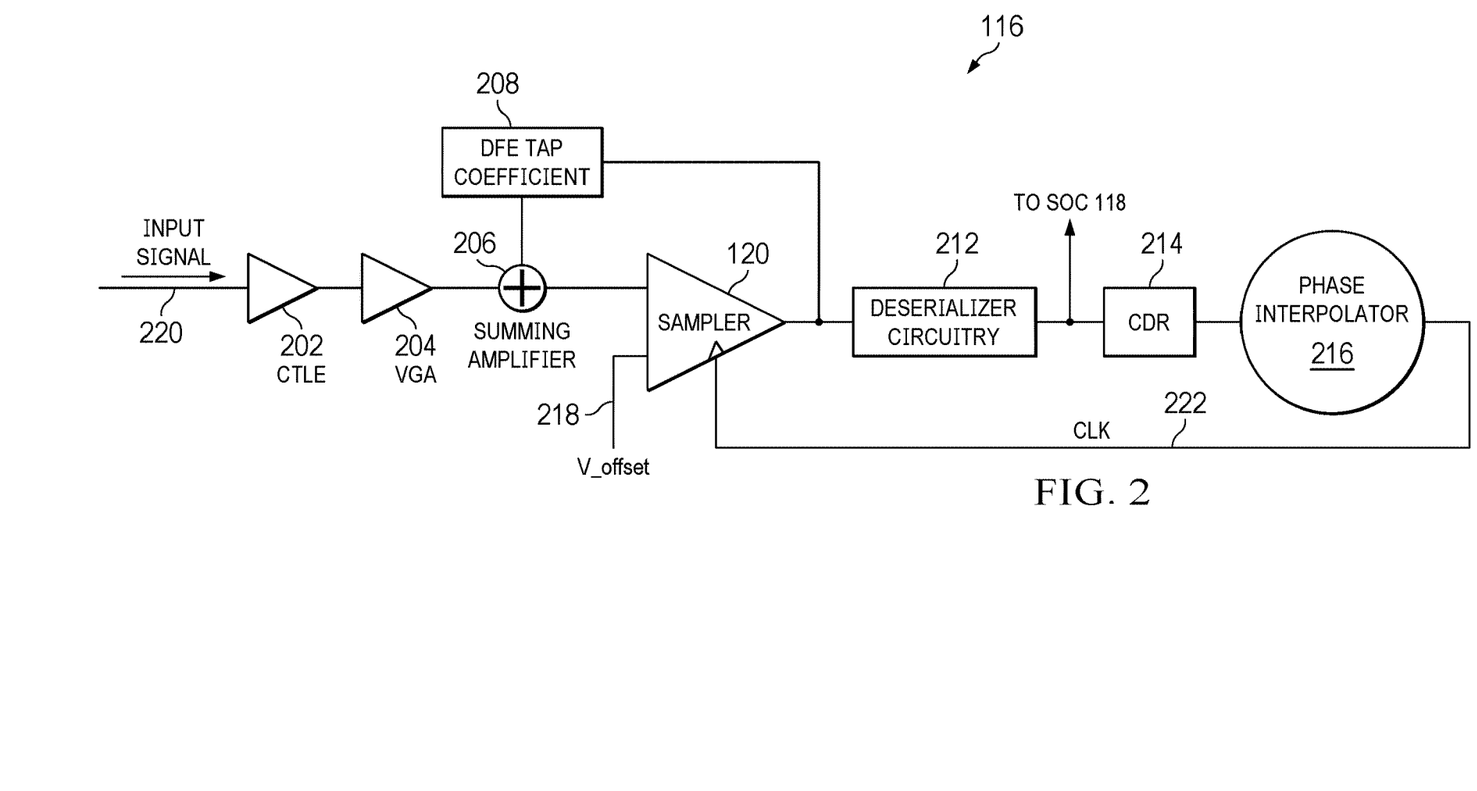
FIG. 2 is a block diagram of a deserializer in various examples.

FIG. 2 is a block diagram of a deserializer 116 in various examples herein. Deserializer 116 includes a continuous time linear equalization filter (CTLE) 202, a variable gain amplifier (VGA) 204, a summing amplifier 206, a DFE tap coefficient 208, and sampler 120. Deserializer 116 also includes deserializer circuitry 212, clock and data recovery (CDR) 214, and a phase interpolator 216. FIG. 2 also shows a voltage offset (V_offset) 218, input signal 220, and clock (CLK) signal 222. In other examples, deserializer 116 may include other components, or may not include some of the components shown in FIG. 2. The components in deserializer 116 may be located on one chip or multiple chips.

CTLE 202 has an input that is coupled to coaxial cable 106 (not shown in FIG. 2) in one example. CTLE 202 has an output coupled to the input of VGA 204. Summing amplifier 206 has a first input coupled to the output of VGA 204 and a second input coupled to an output of DFE tap coefficient 208. Summing amplifier 206 has an output coupled to a first input of sampler 120. A second input of sampler 120 is coupled to a terminal that provides a voltage offset 218. Sampler 120 has an output coupled to an input of deserializer circuitry 212. The output of sampler 120 is also coupled to an input of DFE tap coefficient 208. An output of deserializer circuitry 212 is coupled to an input of CDR 214. The output of deserializer circuitry 212 is also coupled to processor SOC 118 (not shown in FIG. 2). CDR 214 has an output coupled to an input of phase interpolator 216. Phase interpolator 216 has an output coupled to a clock input of sampler 120.

In operation, deserializer 116 receives a serialized input signal 220 (for example, from coaxial cable 106). CTLE 202 equalizes the incoming input signal 220, and VGA 204 amplifies the input signal 220. Summing amplifier 206, DFE tap coefficient 208, and sampler 120 are a DFE circuit in one example.

Sampler 120 samples the incoming signal in time with the CLK signal 222. Sampler 120 decides if the incoming signal is 1 or 0, and then feeds the signal back to the summing amplifier 206 with the DFE tap coefficient 208.

The feedback loop of the DFE circuit includes a timing requirement. The decision from sampler 120 has to feed back within one unit interval (1 UI) of the data signal. Therefore, a smaller delay from the sampler 120 provides better results. In an example sampler 120, the input from the summing amplifier 206 to the sampler 120 is AC-coupled, and the V_offset 218 is applied directly to the same input using a resistor. Therefore, the V_offset 218 is added at the input node of sampler 120 along with the incoming signal. This structure eliminates the need for another differential input pair, as described above, which improves the noise and sensitivity. In some examples, the deserializer 116 may have more than one DFE tap. In other examples, a loop-unrolled DFE is implemented instead of direct feedback to avoid critical timing requirements of a first DFE tap.

Deserializer circuitry 212 receives the serial input bits from sampler 120 and deserializes, such as deserializing the input bits 1:16 to create 16 parallel bits. The 16 parallel bits are provided to SOC 118 and to CDR 214. CDR 214 determines whether the clock signal is centered to the data, and then adjusts the phase of the clock using the phase interpolator 216.

Figure 3:
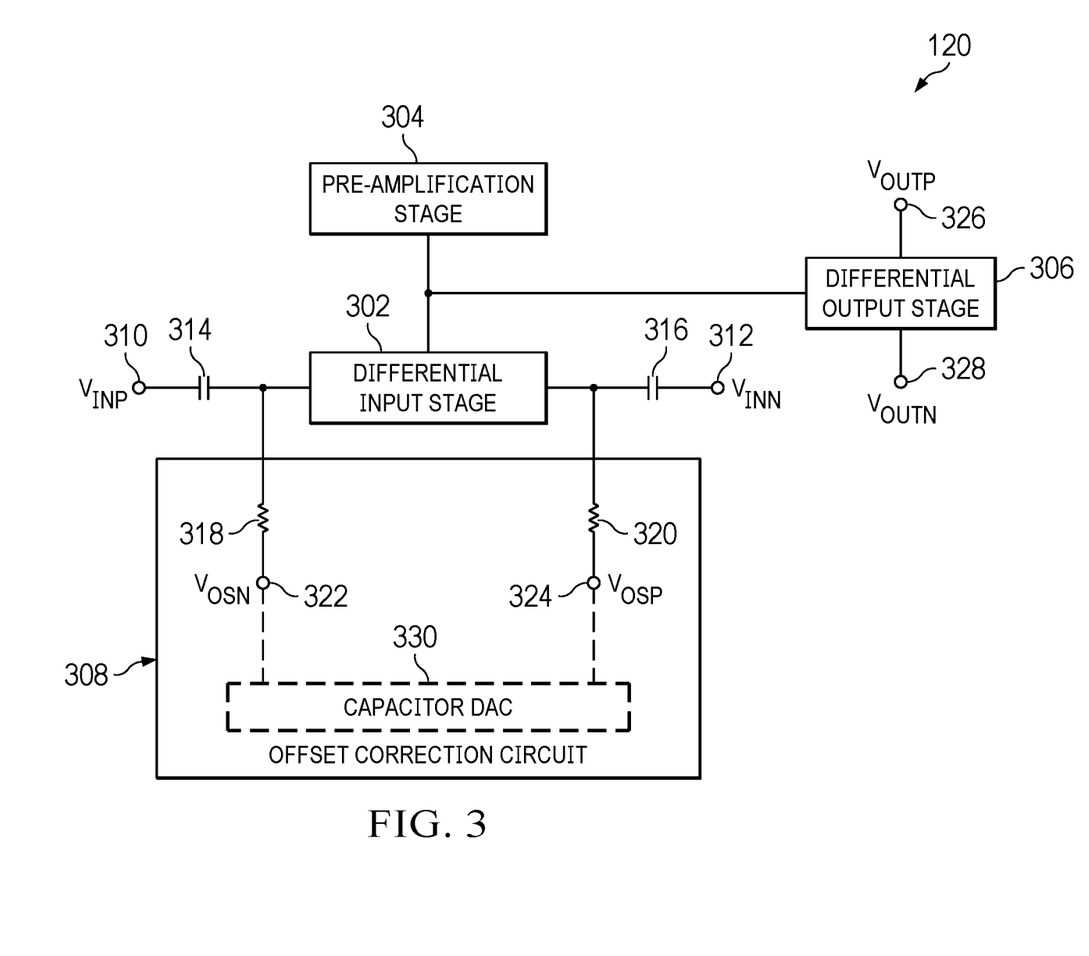
FIG. 3 is a block diagram of a sampler in various examples.

FIG. 3 is a block diagram of a sampler 120 in various examples herein. Sampler 120 includes a differential input circuit 302 (also referred to as a differential input stage 302), a pre-amplifier circuit 304 (also referred to as a pre-amplification stage 304), a differential output circuit 306 (also referred to as a differential output stage 306), an offset correction circuit 308, and capacitors 314 and 316. Sampler 120 also has a first input voltage terminal 310, a second input voltage terminal 312, offset voltage terminals 322 and 324, a first output voltage terminal 326 ($V_{OUTP}$), and a second output voltage terminal 328 ($V_{OUTN}$).

Offset correction circuit 308 includes resistors 318 and 320 and offset voltage terminals 322 and 324. Offset correction circuit 308 may further include circuitry 330 that provides one or more offset voltages to the offset voltage terminals 322 and 324. In the example shown, the circuitry 330 is implemented as a capacitor digital-to-analog (DAC) converter. The capacitor DAC 330 may be coupled to a processor (not shown) that provides digital codes to the capacitor DAC 330. However, any suitable circuitry may be used to supply the one or more offset voltages to the offset voltage terminals 322 and 324.

Differential input stage 302 has an output coupled to an input of pre-amplification stage 304 and an input of differential output stage 306. Capacitor 314 has a first capacitor terminal coupled to first input voltage terminal 310 and a second capacitor terminal coupled to differential input stage 302 and to resistor 318. Capacitor 316 has a first capacitor terminal coupled to second input voltage terminal 312 and a second capacitor terminal coupled to differential input stage 302 and to resistor 320. Resistor 318 has a first terminal coupled to differential input stage 302 and a second terminal coupled to offset voltage terminal 322. Resistor 320 has a first terminal coupled to differential input stage 302 and a second terminal coupled to offset voltage terminal 324. Offset correction circuit 308 has a first terminal coupled to differential stage 302 and capacitor 314, and has a second terminal coupled to differential stage 302 and capacitor 316.

In an example, a differential input signal is received at first input voltage terminal 310 and second input voltage terminal 312. For instance, a voltage $V_{INP}$ (positive input voltage) is received at first input voltage terminal 310, and a voltage $V_{INN}$ (negative input voltage) is received at second input voltage terminal 312. Differential input stage 302 receives the differential input signal. An example differential input stage 302 is described with respect to FIG. 4.

In this example, a differential output signal is provided at first output voltage terminal 326 and second output voltage terminal 328. For instance, a voltage $V_{OUTP}$ (positive output voltage) is provided at first output voltage terminal 326, and a voltage $V_{OUTN}$ (negative output voltage) is provided at second output voltage terminal 328. Differential output stage 306 provides the differential output signal. An example differential output stage 306 is described with respect to FIG. 4.

In an example operation, an offset voltage is applied across offset voltage terminals 322 and 324. Here, a voltage VOSN is received at offset voltage terminal 322, and a voltage VOSP is received at offset voltage terminal 324. In this example, the offset voltage is not provided to sampler 120 using a differential input pair, which reduces noise in sampler 120. The offset voltage allows the differential input signal to be sliced at a certain reference voltage. Resistors 318 and 320 provide a high impedance input for the offset voltage, so the offset voltage is defined at any suitable value. Capacitors 314 and 316 AC-couple the differential input signal provided to the differential input stage 302. In one example, the values of resistors 318 and 320 and capacitors 314 and 316 are set to create a resistor-capacitor (RC) value of around 10 Megahertz (MHz). Capacitors 314 and 316 are around 150 femtofarads, and resistors 318 and 320 are about 100 kiloohms in one example. The offset voltage is set between 0 V and 800 mV in some examples.

Pre-amplification stage 304 amplifies the differential input signal so that an amplified signal is provided to the differential output stage 306. Pre-amplification stage 304 includes any suitable circuitry for amplifying the differential input signal. An example pre-amplification stage 304 is described with respect to FIG. 4.

When implemented as a cross-coupled latch, differential output stage 306 receives the amplified differential input signal from the differential input stage 302 and latches or captures the data sample responsive to a clock signal. The differential output stage 306 produces a high or low value (e.g., the data sample) based on the differential input signal at the differential output. The sampler 120 provides the data sample to deserializer circuitry 212 show in FIG. 2. An example cross-coupled latch is described below that is faster than a strongARM latch circuit.

Figure 4:
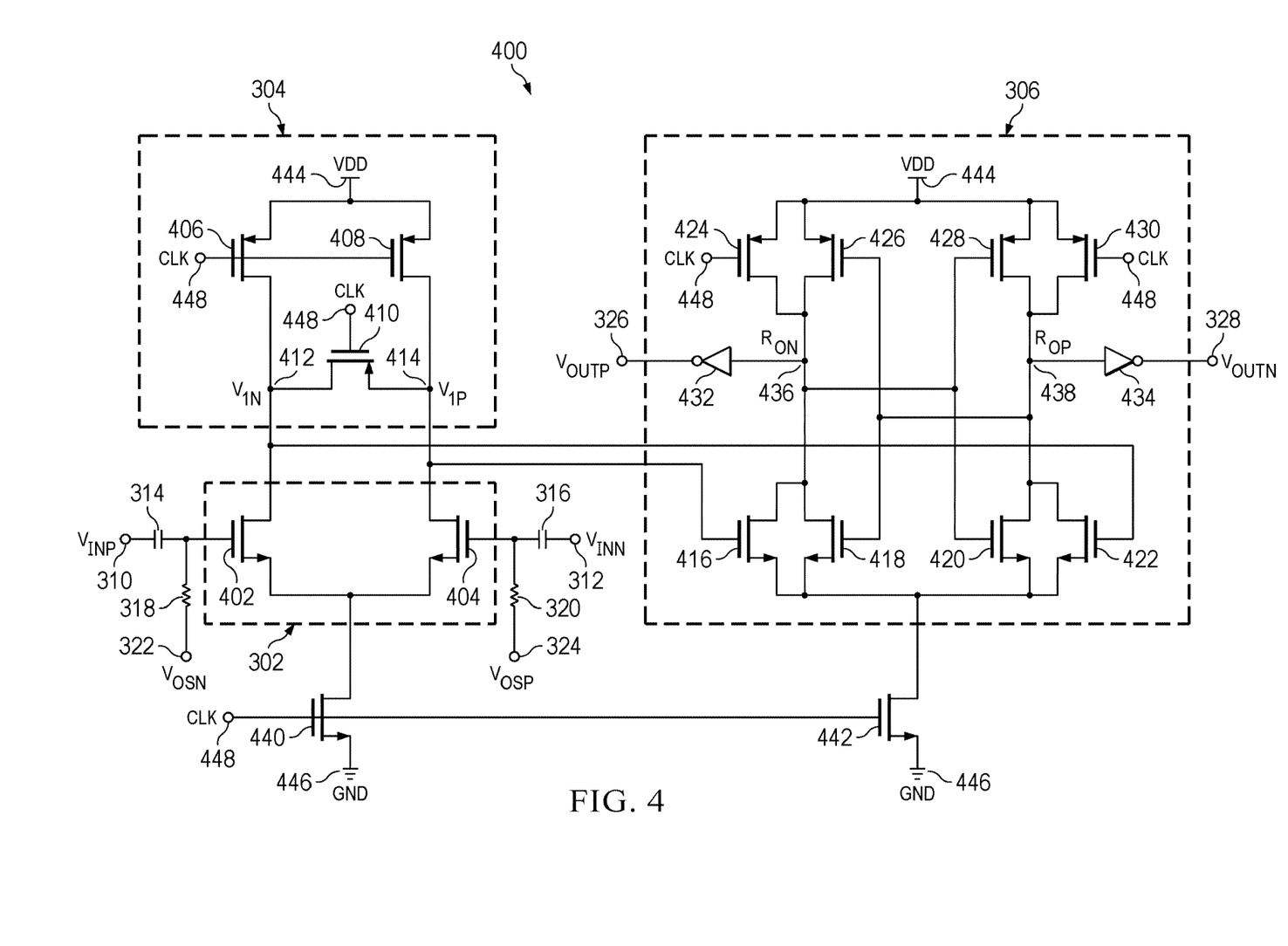
FIG. 4 is a circuit diagram of a sampler in various examples.

FIG. 4 is a circuit diagram of a sampler 400 in various examples herein. Sampler 400 is an example of the sampler 120 in some examples. Sampler 400 includes differential input stage 302, pre-amplification stage 304, and differential output stage 306. Sampler 400 includes first input voltage terminal 310, second input voltage terminal 312, capacitors 314 and 316, resistors 318 and 320, offset voltage terminals 322 and 324, first output voltage terminal 326, and second output voltage terminal 328, as described above with respect to FIG. 3.

Differential input stage 302 includes transistors 402 and 404. Pre-amplification stage 304 includes transistors 406, 408, and 410. Nodes 412 (VIN) and 414 (VIP) are also show in pre-amplification stage 304. Differential output stage 306 includes transistors 416, 418, 420, 422, 424, 426, 428, and 430. Differential output stage 306 includes inverters 432 and 434, and nodes 436 (RON) and 438 ($R_{OP}$).

Sampler 400 also includes transistors 440 and 442. First voltage terminal 444 provides a voltage $V_{DD}$ to sampler 400. Second voltage terminal 446 provides a second voltage to sampler 400, which is ground (GND) in one example. Sampler 400 also receives a clock (CLK) signal provided by a clock source (not shown) via clock terminals 448.

In this example, the transistors in sampler 400 are field effect transistors (FETs). However, other types of transistors may be used in other examples. As shown, transistors 402, 404, 416, 418, 420, 422, 440, and 442 are n-channel FETs, and transistors 406, 408, 410, 424, 426, 428, and 430 are p-channel FETs. In an example, the transistors described herein each include a gate or control terminal. In an example, each of the transistors described herein also includes a source terminal and a drain terminal, which are referred to herein as a first terminal and a second terminal, or vice versa.

As shown, transistor 402 includes a gate or control terminal coupled to capacitor 314 and resistor 318. First input voltage terminal 310 provides a positive portion of the differential input signal (e.g., $V_{INP}$) to the gate of transistor 402. A drain of transistor 402 is coupled to node 412 and transistor 406, and a source of transistor 402 is coupled to transistor 404 and to transistor 440. Transistor 404 includes a gate or control terminal coupled to capacitor 316 and resistor 320. Second input voltage terminal 312 provides a negative portion of the differential input signal (e.g., $V_{INN}$) to the gate of transistor 404. A drain of transistor 404 is coupled to node 414 and transistor 408, and a source of transistor 404 is coupled to transistor 402 and to transistor 440. Differential input stage 302 receives the differential input signal across first input voltage terminal 310 and second input voltage terminal 312. The differential input signal being offset by the offset voltage provided by offset voltage terminals 322 and 324. The differential input signal is amplified by pre-amplification stage 304 and then provided to differential output stage 306 for sampling.

Pre-amplification stage 304 includes transistors 406, 408, and 410. Transistor 406 has a gate or control terminal coupled to clock terminal 448. Transistor 406 has a source coupled to first voltage terminal 444 and a drain coupled to node 412 and transistor 402. Transistor 408 has a gate or control terminal coupled to clock terminal 448 and the gate of transistor 406. Transistor 408 has a source coupled to first voltage terminal 444 and a drain coupled to node 414 and transistor 404. Transistor 410 has a gate coupled to clock terminal 448, a drain coupled to node 412, and a source coupled to node 414. Transistors 406, 408, and 410 are clock-gated transistors. Clock-gated transistors receive a clock signal at their gate or control terminal, and these transistors are turned on or off based on the clock signal.

Differential output stage 306 includes transistors 416, 418, 420, 422, 424, 426, 428, and 430, inverters 432 and 434, and nodes 436 ($R_{ON}$) and 438 ($R_{OP}$). Transistor 416 has a gate coupled to node 414, a drain coupled to the drain of transistor 418 and node 436, and a source coupled to the sources of transistors 418, 420, and 422. Transistor 418 has a gate coupled to the gate of transistor 426 and to node 438. Transistor 418 has a drain coupled to the drain of transistor 416 and a source coupled to the sources of transistors 416, 420, and 422. Transistor 420 has a gate coupled to the gate of transistor 428 and node 436, a drain coupled to the drain of transistor 422, and a source coupled to the sources of transistors 416, 418, and 422. Transistor 422 has a gate coupled to node 412, a drain coupled to the drain of transistor 420, and a source coupled to the sources of transistors 416, 418, and 420. As shown in FIG. 4, transistors 416 and 422 are coupled to differential input stage 302 and pre-amplification stage 304 via their respective gates or control terminals. Therefore, transistors 416 and 422 are the components of differential output stage 306 that receive the differential input signal from differential input stage 302.

Transistor 424 in differential output stage 306 has a gate coupled to clock terminal 448, a drain coupled to node 436 and the drain of transistor 426, and a source coupled to first voltage terminal 444. Transistor 426 has a gate coupled to the gate of transistor 418 and node 438, a drain coupled to node 436 and the drain of transistor 424, and a source coupled to first voltage terminal 444. Transistor 428 has a gate coupled to the gate of transistor 420 and node 436, a drain coupled to node 438 and the drain of transistor 430, and a source coupled to first voltage terminal 444. Transistor 430 has a gate coupled to clock terminal 448, a drain coupled to node 438 and the drain of transistor 428, and a source coupled to first voltage terminal 444. Transistors 424 and 430 are clock-gated transistors.

Differential output stage 306 also includes inverters 432 and 434. Inverter 432 has an inverter input coupled to node 436 and an inverter output coupled to first output voltage terminal 326 ($V_{OUTP}$). Inverter 434 has an inverter input coupled to node 438 and an inverter output coupled to second output voltage terminal 328 ($V_{OUTN}$). A differential output signal is provided across output voltage terminals 326 and 328.

Sampler 400 also includes transistors 440 and 442. Transistor 440 has a gate coupled to clock terminal 448, a drain coupled to the sources of transistors 402 and 404, and a source coupled to second voltage terminal 446 (e.g., ground). Transistor 442 has a gate coupled to the gate of transistor 440 and clock terminal 448, a drain coupled to the sources of transistors 416, 418, 420, and 422, and a source coupled to second voltage terminal 446 (e.g., ground). Transistors 440 and 442 are clock-gated transistors.

In operation, sampler 400 receives a differential input signal at differential input stage 302. Pre-amplification stage 304 amplifies the differential input signal and provides the differential input signal to differential output stage 306 when clock signal is high. Differential output stage 306 comes out of reset when clock signal goes from low to high and decides (0 or 1) based on the differential input signal, and provides a differential output signal across output voltage terminals 326 and 328.

Sampler 400 latches the differential input signal to produce an output signal responsive to a clock signal from a clock source provided to clock terminals 448. The differential input signal is received at first input voltage terminal 310 and second input voltage terminal 312. The input signal is not latched until the clock signal goes high. First, the clock signal is low when the input signal is received. Therefore, a low value is provided at clock terminals 448. If the voltage at clock terminal 448 is low, transistors 406 and 408 turn on due to the low voltage at their respective gates. Therefore, nodes 412 and 414 are pulled high to $V_{DD}$. Transistor 410 is also turned on due to the low clock signal at its gate. Transistors 424, 426, 428, and 430 are also turned on responsive to the low clock signal at clock terminal 448, and nodes 436 and 438 are pulled high to $V_{DD}$. The low clock signal also turns off transistors 440 and 442. If transistor 440 is off, transistors 402 and 404 of the differential input stage are also off. If transistor 442 is off, transistors 416, 418, 420, and 422 are also off.

Because the low clock signal pulls nodes 412, 414, 436, and 438 high, sampler 400 can quickly latch and provide a differential output signal that meets the timing requirements of the SerDes when the clock transitions. Responsive to the clock signal transitioning from low to high, sampler 400 will latch the value of the differential input signal and produce a differential output signal. As described above, the differential input signal is received across first input voltage terminal 310 and second input voltage terminal 312. Offset voltage terminals 322 and 324 can increase the level of the differential input signal by providing an offset voltage at the differential input. As described above, by providing the offset voltage directly at the differential input stage 302 rather than with a second differential input pair, noise is reduced.

The differential input signal is received at first input voltage terminal 310 and second input voltage terminal 312, which produces a small voltage difference between these two voltage terminals. When the clock transitions from low to high, transistors 440 and 442 turn on due to the high clock signal at their respective gates. Transistor 440 turns on and pulls the source terminals of transistors 402 and 404 low (e.g., towards ground). Transistors 402 and 404 have the differential input signal at their respective gates, and their sources pulled low, which therefore turns on transistors 402 and 404. When transistors 402 and 404 turn on, the voltages at nodes 412 and 414 are pulled down. At this time, transistors 406, 408, and 410 have a low clock signal at their respective gates, so the voltages at nodes 412 and 414 are pulled down by transistors 402 and 404. These voltages (VIN and VIP, respectively), will be pulled close to zero (e.g., ground) with a voltage difference between them, where the voltage difference is based on the differential input voltage.

The voltage signals at nodes 412 and 414 are provided to differential output stage 306. Node 414 is coupled to the gate of transistor 416, and node 412 is coupled to the gate of transistor 422. A high clock signal at the gate of transistor 442 turns on transistor 442, which causes transistors 416, 418, 420, and 422 turning on. The voltage values at nodes 436 and 438 were high, but are now pulled low due to the clock signal going high and transistors 416, 418, 420, and 422 turning on. The voltage values at nodes 436 and 438 are slightly pulled down before latching to their final values. One node (436 or 438) will latch to a high value, and the other node (436 or 438) will latch to a low value. These values are inverted by inverters 432 and 434, and then the differential output signal is provided at output voltage terminals 326 and 328.

In one example operation, the differential input signal at second input voltage terminal 312 ($V_{INN}$) is higher than the signal at first input voltage terminal 310 ($V_{INP}$). Therefore, when the clock transitions from low to high, transistor 404 conducts slightly more current than transistor 402. This causes the voltage at node 414 to discharge faster than the voltage at node 412 (e.g., the voltage at node 414 is pulled lower than the voltage at node 412). A higher voltage at node 412 than node 414 causes transistor 422 to turn on faster than transistor 416 in the differential output stage 306. Because transistor 422 turns on faster than transistor 416, transistor 426 turns on faster than transistor 428. Transistor 426 has a drain coupled to node 436, and node 436 is pulled high faster than node 438. Therefore, the voltage at node 436 latches high, and the voltage at node 438 latches low. The inverters 432 and 434 invert these voltages before providing the differential output voltage to output voltage terminals 326 and 328. $V_{OUTP}$ at first output voltage terminal 326 goes low, and $V_{OUTN}$ at second output voltage terminal 328 goes high. In sum, a higher input signal $V_{INN}$ produces a higher output signal $V_{OUTN}$. In the opposite operation, if the differential input signal at first input voltage terminal 310 ($V_{INP}$) is higher than the signal at second input voltage terminal 312 ($V_{INN}$), $V_{OUTP}$ (first output voltage terminal 326) will provide a high output signal and $V_{OUTN}$ (second output voltage terminal 328) will provide a low output signal.

In the examples described herein, the sampler circuit applies an offset voltage to the input signal without using a second differential input pair. The offset voltage is AC-coupled to the input signal differential pair. This structure provides a high impedance input for the offset voltage, which provides lower noise and higher sensitivity. The latch described herein has fewer stacks of transistors than the strongARM latch circuit, which increases the speed of the sampler circuit. The latch in the sampler circuit described herein also has a fast regeneration time. The sampler circuit described herein also includes a pre-amplification stage that improves the sensitivity of the sampler circuit.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While the use of particular transistors are described herein, other transistors (or equivalent devices) may be used instead with little or no change to the remaining circuitry. For example, a metal-oxide-silicon field-effect transistor ("MOSFET") (such as an n-channel MOSFET, nMOSFET, or a p-channel MOSFET, pMOSFET), a bipolar junction transistor (BJT—e.g., NPN or PNP), insulated gate bipolar transistors (IGBTs), and/or junction field effect transistor (JFET) may be used in place of or in conjunction with the devices described herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs). In general, herein, a transistor has a control input/control terminal (e.g., a gate, base) and two additional terminals (e.g., source/drain, collector/emitter).

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device, or a semiconductor component. Furthermore, a voltage rail or more simply a "rail," may also be referred to as a voltage terminal and may generally mean a common node or set of coupled nodes in a circuit at the same potential.

What is claimed is:

1. A circuit comprising:
   a differential input circuit having a first input at a first capacitor terminal and a second input
      at a second capacitor terminal, the differential input circuit including:
      a first transistor having a first transistor control terminal and first and second terminals; and
      a second transistor having a second transistor control terminal and first and second terminals, the first terminals of the first and second transistors coupled together;
   a first capacitor having the first capacitor terminal and having another terminal coupled to the first transistor control terminal;
   a second capacitor having the second capacitor terminal and having another terminal coupled to the second transistor control terminal;
   a first offset correction input coupled to the first transistor control terminal and a second offset correction input coupled to the second transistor control terminal; and
   a differential output circuit having a first output at a first inverter output, having a second output at a second inverter output, having a third transistor control terminal coupled to the second terminal of the first transistor, and having a fourth transistor control terminal coupled to the second terminal of the second transistor.

2. The circuit of claim 1, further comprising:
   a first resistor having a first terminal coupled to the first transistor control terminal, and having a second terminal as the first offset correction input; and
   a second resistor having a first terminal coupled to the second transistor control terminal, and having a second terminal as the second offset correction input.

3. The circuit of claim 2, further comprising a capacitor digital-to-analog converter coupled to the second terminals of the first and second resistors.

4. The circuit of claim 1, further comprising a cross-coupled latch, wherein the cross-coupled latch comprises:
   a third transistor having a third transistor control terminal coupled to the first transistor and having first and second terminals;
   a fourth transistor having a fourth transistor control terminal coupled to the second transistor and having first and second terminals, the first terminals of the third and fourth transistors coupled together;
   a fifth transistor having a fifth transistor control terminal coupled to the third transistor and having first and second terminals; and
   a sixth transistor having a sixth transistor control terminal coupled to the fourth transistor and having first and second terminals, the first terminals of the fifth and sixth transistors coupled together, and wherein the cross-coupled latch includes a differential output.

5. The circuit of claim 4, wherein the differential output circuit includes:
   a first inverter having the first inverter output and having an input coupled to the second terminal of the fourth transistor; and
   a second inverter having the second inverter output and having an input coupled to the second terminal of the third transistor.

6. The circuit of claim 1, further comprising:
   a pre-amplifier circuit having a first terminal coupled to the second terminal of the first transistor and to the third transistor control terminal and having a second terminal coupled to the second terminal of the second transistor and to the fourth transistor control terminal.

7. The circuit of claim 6, wherein the pre-amplifier circuit includes:
   a third transistor having a control terminal and first and second terminals, wherein the first terminal of the third transistor is coupled to the first transistor and a cross-coupled latch; and
   a fourth transistor having a control terminal and first and second terminals, wherein the first terminal of the fourth transistor is coupled to the second transistor and the cross-coupled latch.

8. A circuit comprising:
   a differential input circuit including:
      a first transistor having a first transistor control terminal and first and second terminals; and
      a second transistor having a second transistor control terminal and first and second terminals, the first terminals of the first and second transistors coupled together;
   a first capacitor coupled to the control terminal of the first transistor;
   a second capacitor coupled to the control terminal of the second transistor;
   an offset correction circuit having a first terminal coupled to the control terminal of the first transistor and having a second terminal coupled to the control terminal of the second transistor;
   a differential output circuit including:
      a third transistor having a third transistor control terminal coupled to the second terminal of the first transistor; and
      a fourth transistor having a fourth transistor control terminal coupled to the second terminal of the second transistor; and
   a pre-amplifier circuit having a first terminal coupled to the second terminal of the first transistor and to the control terminal of the third transistor, and having a second terminal coupled to the second terminal of the second transistor and to the control terminal of the fourth transistor.

9. The circuit of claim 8, wherein the offset correction circuit includes:
   a first resistor having the first terminal of the offset correction circuit, which is coupled to the first transistor control terminal, and having a second terminal; and
   a second resistor having the second terminal of the offset correction circuit, which is coupled to the second transistor control terminal, and having a second terminal.

10. The circuit of claim 9, wherein the offset correction circuit includes a capacitor digital-to-analog converter coupled to the second terminals of the first and second resistors.

11. The circuit of claim 8, further comprising a cross-coupled latch, wherein the cross-coupled latch comprises:
    a fifth transistor having a fifth transistor control terminal coupled to the third transistor and having first and second terminals; and a sixth transistor having a sixth transistor control terminal coupled to the fourth transistor and having first and second terminals, the first terminals of the fifth and sixth transistors coupled together, and wherein the cross-coupled latch includes a differential output.

12. The circuit of claim 11, wherein the differential output circuit includes:
a first inverter having a first inverter output and having an input coupled to the second terminal of the fourth transistor; and
a second inverter having a second inverter output and having an input coupled to the second terminal of the third transistor.

13. The circuit of claim 8, further comprising:
a pre-amplifier circuit having a first terminal coupled to the second terminal of the first transistor and to the third transistor control terminal, and having a second terminal coupled to the second terminal of the second transistor and to the fourth transistor control terminal.

14. The circuit of claim 13, wherein the pre-amplifier circuit includes:
a fifth transistor having a fifth transistor control terminal and first and second terminals, wherein the first terminal of the fifth transistor is coupled to the first transistor and a cross-coupled latch; and
a sixth transistor having a sixth transistor control terminal and first and second terminals, wherein the first terminal of the sixth transistor is coupled to the second transistor and the cross-coupled latch.

15. A system, comprising:
an equalizer having an output;
an amplifier having an input coupled to the output of the equalizer, and having an output;
a sampler having a first input coupled to the output of the amplifier, having an offset input, and having an output, the sampler including:
 a differential input circuit having a first input at a first capacitor terminal and a second input at a second capacitor terminal, the differential input circuit including a first transistor and a second transistor, the first transistor having a first transistor control terminal and first and second terminals, and the second transistor having a second transistor control terminal and first and second terminals;
 a first capacitor having the first capacitor terminal and having another terminal coupled to the first transistor control terminal;
 a second capacitor having the second capacitor terminal and having another terminal coupled to the second transistor control terminal;
 a differential output circuit having a first output at a first inverter output, having a second output at a second inverter output, having a third transistor with a third transistor control terminal coupled to the second terminal of the first transistor, and having a fourth transistor with a fourth transistor control terminal coupled to the second terminal of the second transistor; and
 a deserializer having an input coupled to the output of the sampler.

16. The system of claim 15, wherein the sampler further comprises:
a fifth transistor having a fifth transistor control terminal and first and second terminals, wherein the first terminal of the fifth transistor is coupled to the second terminal of the first transistor and the second terminal of the second transistor, and wherein the fifth transistor is configured to turn on the first transistor and the second transistor.

17. The system of claim 16, wherein the sampler further comprises:
a sixth transistor having a sixth transistor control terminal and first and second terminals, wherein the first terminal of the sixth transistor is coupled to a cross-coupled latch, and wherein the sixth transistor is configured to turn on one or more transistors in the cross-coupled latch.

18. The system of claim 15, further comprising:
a cross-coupled latch coupled to the second terminal of the first transistor and the second terminal of the second transistor.

19. The system of claim 15, wherein the sampler further comprises:
a pre-amplifier circuit having a first terminal coupled to the second terminal of the first transistor and to the third transistor control terminal, and having a second terminal coupled to the second terminal of the second transistor and to the fourth transistor control terminal.

20. The system of claim 19, wherein the pre-amplifier circuit includes:
a fifth transistor having a fifth transistor control terminal and first and second terminals, wherein the first terminal of the fifth transistor is coupled to the first transistor and a cross-coupled latch; and
a sixth transistor having a sixth transistor control terminal and first and second terminals, wherein the first terminal of the sixth transistor is coupled to the second transistor and the cross-coupled latch.

* * * * *